United States Patent [19]
Dreiske et al.

[11] Patent Number: 5,665,998
[45] Date of Patent: Sep. 9, 1997

[54] GEOMETRIC ENHANCEMENT OF PHOTODIODES FOR LOW DARK CURRENT OPERATION

[75] Inventors: Peter D. Dreiske, Plano; Arthur M. Turner, Allen; David L Forehand, Wylie, all of Tex.

[73] Assignee: Texas Instruments Incorporated, Dallas, Tex.

[21] Appl. No.: 601,557

[22] Filed: Feb. 14, 1996

Related U.S. Application Data

[62] Division of Ser. No. 247,747, May 23, 1994, Pat. No. 5,593,902.

[51] Int. Cl.[6] .................................................. H01L 31/00
[52] U.S. Cl. .................. 257/446; 257/438; 257/441; 257/442; 257/461; 257/465; 257/466; 438/965
[58] Field of Search ........................... 257/442, 446, 257/461, 465, 466, 438, 441, 444, 445, 447, 448, 458, 459, 460, 462, 463, 464

[56] References Cited

U.S. PATENT DOCUMENTS

| | | | |
|---|---|---|---|
| 4,972,244 | 11/1990 | Buffet et al. | 257/442 |
| 5,040,039 | 8/1991 | Hattori et al. | 257/463 |
| 5,177,580 | 1/1993 | Norton et al. | 257/188 |
| 5,204,539 | 4/1993 | Tsuji et al. | 257/21 |
| 5,243,215 | 9/1993 | Enomoto et al. | 257/443 |
| 5,248,635 | 9/1993 | Bouayad-Amine et al. | 437/228 |

*Primary Examiner*—Ngân V. Ngô
*Assistant Examiner*—Allan R. Wilson
*Attorney, Agent, or Firm*—René E. Grossman; Richard L. Donaldson

[57] ABSTRACT

A substantial portion of the material at the pn junction (27) of the photodiode (37, 41) having an implanted region extending to a surface thereof is selectively removed (39), leaving a very small junction region (35, 43) with the remainder of the p-type (23) and n-type (25) material of each photodiode being spaced apart or electrically isolated at what was originally the junction. In the ion implanted n-type on p-type approach, the majority of the signal is created in the implanted n-type region while the majority of the noise is generated in the p-type region. By selectively removing p-type material, n-type material or both from the pn junction of the diode or otherwise electrically isolating most of the p-type and n-type regions from each other at the pn junction and thereby minimizing the pn junction area, noise is greatly reduced without affecting the signal response of the photodiode. With this approach, the present implant technology can still be used with the achievement of high temperature operational capability above 77° Kelvin and up to about 110° Kelvin.

20 Claims, 1 Drawing Sheet

GEOMETRIC ENHANCEMENT OF PHOTODIODES FOR LOW DARK CURRENT OPERATION

This application is a division of application Ser. No. 08/247,747, filed May 23, 1994 now U.S. Pat. No. 5,593,902.

BACKGROUND OF THE INVENTION

1. Field of the Invention

This invention relates to a process of fabrication of infrared photodiodes and the photodiodes.

2. Brief Description of the Prior Art

There is presently a problem in meeting required specification performance with sufficient margin in staring focal plane arrays (FPAs) when operating at temperatures higher than 77° Kelvin and up to about 110° Kelvin. The present approach of ion implanting long wave infrared (LWIR) material has the advantage of ease of fabrication in a manufacturing environment, however this approach has an inherent limitation of high dark currents at the aforementioned elevated operating temperatures. These dark currents are currents created in the vicinity of the pn junctions independent of any infrared light impinging upon the diode. It is the infrared light which impinges upon the diode that is to be measured. Inherently, electron-hole pairs are generated spontaneously around the pn junction by thermal and field motivated mechanisms. It is these dark currents that impede the ability of the diode to detect small signals. It is also desirable to operate with a single cooling gas at temperatures higher than the present liquid nitrogen which is 77° K. Generally, the higher the possible operating temperature of the system, the lower the cost of operation. Accordingly, operation at the temperature of liquid argon which is 88° to 90° Kelvin or at even higher temperatures is desirable. At present, the signal to noise ratio of the above described system is generally not tolerable with operation at temperatures higher than that of liquid nitrogen.

SUMMARY OF THE INVENTION

It has been determined that the signal is collected essentially totally in the n-type region of the photodiode whereas the noise mechanism is created almost exclusively in the p-type region. Therefore, removal of as much of the p-type volume as possible around the n-type collection region (at the junction) will geometrically reduce the amount of noise while maintaining the amount of signal collection region.

In accordance with the present invention, a substantial portion of the material at the pn junction of the photodiode is selectively removed, leaving a very small junction region with the remainder of the p-type and n-type material of each photodiode being spaced apart at what was originally the junction. In the ion implanted n-type or p-type approach, the majority of the signal is created in the implanted n-type region while the majority of the noise is generated in the p-type region. By selectively removing p-type material, n-type material or both from the pn junction of the diode and thereby minimizing the pn junction area, noise is greatly reduced without affecting the signal response of the photodiode. With this approach, the present implant technology can still be used with the achievement of high temperature operational capability up to temperatures at or above 90° Kelvin and up to about 110° Kelvin.

Briefly, the above is accomplished by providing a slab of semiconductor material of any group II–VI material, group III–V material, silicon or germanium having an ion implanted pn junction which is capable of collecting energy from the outside world and converting it to a voltage, preferably p-type HgCdTe. The slab has opposite conductivity ion implanted regions, preferably n-type regions, which extend partially through or preferably entirely through the slab to the back side thereof and form pn junctions to provide diodes in the slab. Dark current is generated only within a diffusion length of the pn junction. In accordance with the present invention, the slab is composed of a material having a short or long diffusion length. The diffusion length is the distance a noise charge will travel before it recombines with an opposite polarity carrier. Noise carriers are electrons in p-type material. The slab materials are known as intrinsically doped or extrinsically doped.

In accordance with the invention, a standard prior art scanning or staring array pixel is altered by preferably using a slab of semiconductor material as discussed above. In addition, the diode, which is composed of a p-type region and an n-type region, one of which, preferably the n-type region, is implanted, into the other region and extends either partially or totally through the other region forms a pn junction extending around the entire periphery of the implanted region, providing a large pn junction area. In accordance with a first embodiment of the invention, the pn junction region of the pixel is removed except for a very small portion of the junction region at which the junction remains. This is accomplished by etching away either the n-type material, the p-type material or both at the former junction region, leaving only the small junction region. As an alternative, the junction can be etched away leaving only a very small junction area extending around the entire former periphery of the junction or extending around a part of the periphery of the former junction, with or without the junction area and extending the full thickness of the former junction region. As an alternative, the former junction region of the pixel is removed as discussed above except that a small junction region remains at opposing corners of the pn junction. In this way the n-type region retains the original flux collection area of the standard implanted pixel, yet the noise-generating diffusion volume on the p-type side of the diode junction is greatly reduced to minimum size required for substrate contact.

DESCRIPTION OF THE PREFERRED EMBODIMENT

Figure 1:
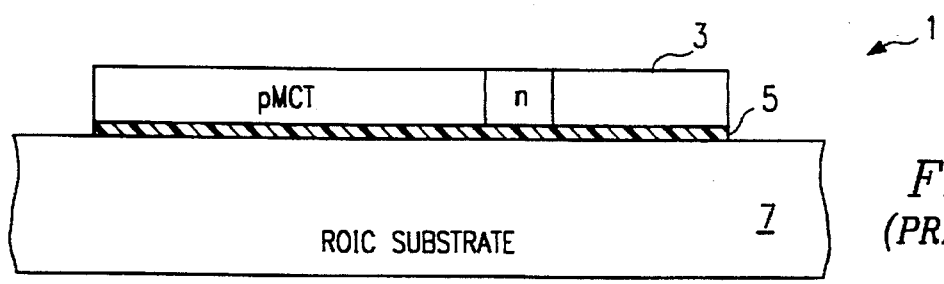
FIG. 1 is a cross-sectional view of a typical prior art focal plane array.
Figure 2:
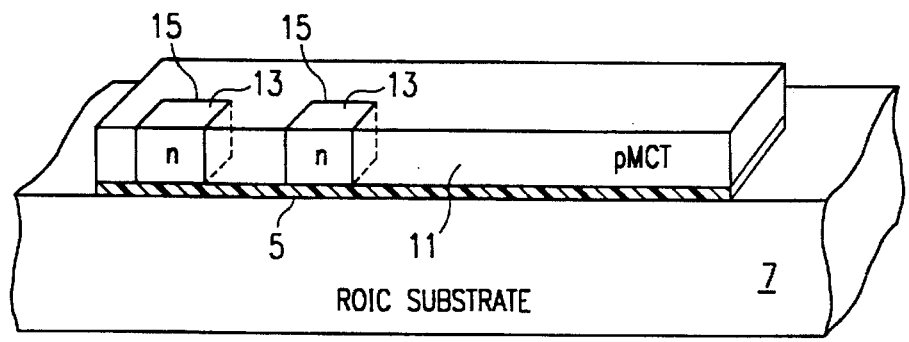
FIG. 2 is a more detailed view of the array of FIG. 1.

Referring first to FIGS. 1 and 2, there is shown a typical prior art focal plane array (FPA) 1 having a slab of HgCdTe 3 composed of a plurality of photodiodes, the slab being glued by an epoxy 5 to an integrated circuit in the form of a silicon processor 7. The slab 3 can be any group II–VI material, group III–V material, silicon or germanium having an ion implanted pn junction which is capable of collecting energy from the outside world and converting it to a voltage. The thickness of the slab 3 has preferably been diminished to about 7 microns by etching or otherwise prior to fabrication of diodes thereon.

The slab 3 in FIG. 2 is preferably p-type HgCdTe 11 having ion implanted n-type regions 13 which extend entirely through the slab to the back side thereof opposing the integrated circuit 7 and form pn junctions 15 to form the diodes in the slab 3 as shown in FIG. 2. Dark current is generated only within a diffusion length of the pn junction.

Figure 3:
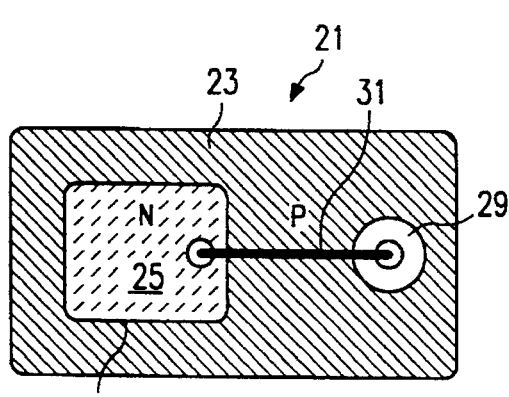
FIG. 3 is a top view of a standard prior art scanning array pixel.
Figure 4:
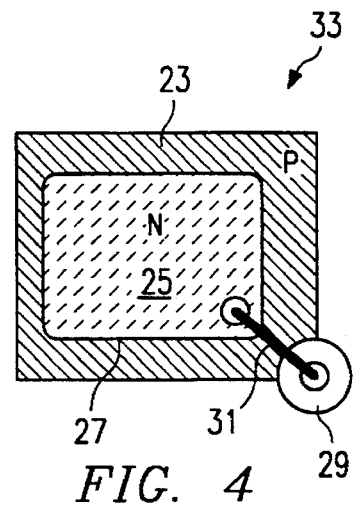
FIG. 4 is a top view of a standard prior art staring array pixel.

Referring now to FIG. 3, there is shown a standard prior art scanning array pixel 21 which is a diode composed of a p-type region 23, an n-type region 25 which has been implanted into the p-type region and extends either partially or totally through the p-type region with a pn junction 27 extending around the entire periphery of the n-type region, providing a large pn junction area. A via 29 is shown in the p-type region for reception of a lead 31 which extends from the n-type region to the integrated circuit substrate 7. FIG. 4 shows a standard prior art staring array pixel 33 which is the same as the pixel of FIG. 3 except that the via extends through the p-type region as well as into the space between pixels so that the pixels can be placed closer together. The principal of operation of the pixels of FIGS. 3 and 4 is the same.

Figure 5:
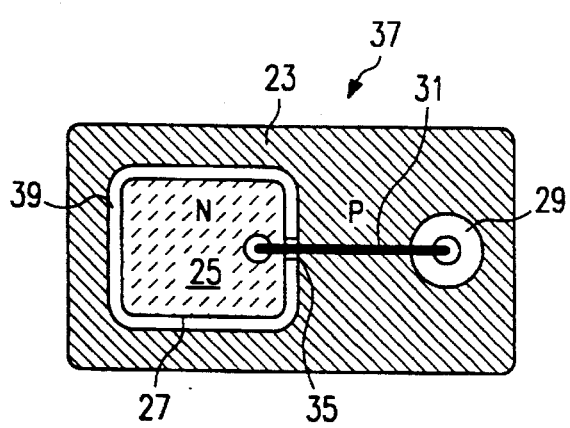
FIG. 5 is a top view of a scanning array pixel in accordance with the present invention.
Figure 6:
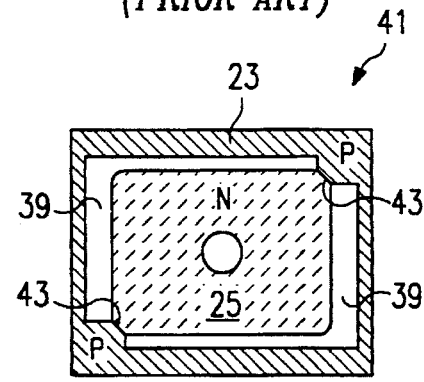
FIG. 6 is a top view of a staring array pixel in accordance with the present invention.

As can be seen in FIG. 5, in accordance with a first embodiment of the invention, the junction region 27 of the pixel 37 has been removed except for a very small region 35 at which the junction remains. This is accomplished by etching away either the n-type material 25, the p-type material 23 or both at the former junction region 39, leaving only the small junction region 35. As an alternative, the junction 27 can be etched away only partially, leaving only a very small junction area extending around the entire former periphery of the junction or extending around a part of the periphery of the former junction, with or without the junction area 35 as described in conjunction with FIG. 5 extending the full thickness of the former junction region. As an alternative, as shown in FIG. 6, the former junction region 27 of the pixel 41 is removed at regions 39 as in FIG. 5 except that a small junction region remains at opposing corners 43. In this way the n-type region 25 retains the original flux collection area of the standard implanted pixel, yet the noise-generating diffusion volume on the p-type side of the diode junction is greatly reduced to minimum size required for substrate contact.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A photodiode comprising:
   (a) a first region of semiconductor material of predetermined conductivity type; and
   (b) a second region of opposite conductivity type surrounded by said first region so that exterior portions thereof oppose exterior portions of said first region and spaced from said first region along a major portion of the second region opposing said first region, the remainder of said second region opposing said first region forming a semiconductor junction with said first region.

2. The photodiode of claim 1 wherein said second region extends to a surface of said first region.

3. The photodiode of claim 1 wherein said second region extends to each of a pair of opposing surfaces of said first region.

4. The photodiode of claim 2 wherein said second region extends to each of a pair of opposing surfaces of said first region.

5. The photodiode of claim 1 wherein said first region is p-type and said second region is n-type.

6. The photodiode of claim 4 wherein said first region is p-type and said second region is n-type.

7. The photodiode of claim 1 wherein said semiconductor material is taken from the group consisting of group II–VI compounds, group III–V compounds, silicon, and germanium.

8. The photodiode of claim 2 wherein said semiconductor material is taken from the group consisting of group II–VI compounds, group III–V compounds, silicon and germanium.

9. The photodiode of claim 1 wherein said semiconductor material is HgCdTe.

10. The photodiode of claim 2 wherein said semiconductor material is HgCdTe.

11. A focal plane array comprising:
    (a) a substrate containing an electrical circuit therein; and
    (b) a photodiode array secured to said substrate and electrically coupled to said substrate, said diode array comprising a plurality of photodiodes, each of said photodiodes including:
       (i) a first region of semiconductor material of predetermined conductivity type; and
       (ii) a second region of opposite conductivity type surrounded by said first region so that exterior portions thereof oppose exterior portions of said first region and spaced from said first region along a major portion of the second region opposing said first region, the remainder of said second region opposing said first region forming a semiconductor junction with said first region.

12. The array of claim 11 wherein said second region extends to a surface of said first region.

13. The array of claim 11 wherein said second region extends to each of a pair of opposing surfaces of said first region.

14. The array of claim 12 wherein said second region extends to each of a pair of opposing surfaces of said first region.

15. The array of claim 11 wherein said first region is p-type and said second region is n-type.

16. The array of claim 14 wherein said first region is p-type and said second region is n-type.

17. The array of claim 11 wherein said semiconductor material is taken from the group consisting of group II–VI compounds, group III–V compounds, silicon and germanium.

18. The array of claim 16 wherein said semiconductor material is taken from the group consisting of group II–VI compounds, group III–V compounds, silicon and germanium.

19. The array of claim 11 wherein said semiconductor material is HgCdTe.

20. The array of claim 18 wherein said semiconductor material is HgCdTe.

* * * * *